United States Patent
Ohl et al.

(10) Patent No.: US 8,158,894 B2
(45) Date of Patent: Apr. 17, 2012

(54) HOUSING HAVING AN ELECTRICAL COMPONENT AND AN ELECTRICAL FEED LINE

(75) Inventors: Christian Ohl, Pfullingen (DE); Alexander Steinert, Schwetzingen (DE)

(73) Assignee: Robert Bosch GmbH, Stuttgart (DE)

( * ) Notice: Subject to any disclaimer, the term of this patent is extended or adjusted under 35 U.S.C. 154(b) by 409 days.

(21) Appl. No.: 11/991,691

(22) PCT Filed: Sep. 6, 2006

(86) PCT No.: PCT/EP2006/066050
§ 371 (c)(1),
(2), (4) Date: Feb. 24, 2009

(87) PCT Pub. No.: WO2007/028802
PCT Pub. Date: Mar. 15, 2007

(65) Prior Publication Data
US 2009/0229877 A1 Sep. 17, 2009

(30) Foreign Application Priority Data
Sep. 7, 2005 (DE) .......................... 10 2005 042 491

(51) Int. Cl.
*H05K 7/02* (2006.01)

(52) U.S. Cl. ....................................... 174/541; 439/279
(58) Field of Classification Search .................. 174/528, 174/541, 536; 439/279
See application file for complete search history.

(56) References Cited

U.S. PATENT DOCUMENTS

| | | | | |
|---|---|---|---|---|
| 3,906,311 A | * | 9/1975 | Shoot et al. | 361/518 |
| 5,253,143 A | * | 10/1993 | Klinger et al. | 361/736 |
| 5,998,733 A | * | 12/1999 | Smith | 174/50.52 |
| 2003/0196318 A1 | | 10/2003 | Buck | |

FOREIGN PATENT DOCUMENTS

| | | |
|---|---|---|
| DE | 198 01 006 | 7/1999 |
| DE | 203 18 242 | 4/2004 |
| EP | 974250 | 1/2000 |

\* cited by examiner

*Primary Examiner* — Hung Ngo
(74) *Attorney, Agent, or Firm* — Kenyon & Kenyon LLP

(57) ABSTRACT

A housing having at least one electrical component situated therein and at least one electrical feed line, the housing having at least one through-opening, the electrical feed line being guided through the through-opening from an external environment into the interior of the housing, and there being an electrical connection between the electrical component and the electrical feed line.

11 Claims, 2 Drawing Sheets

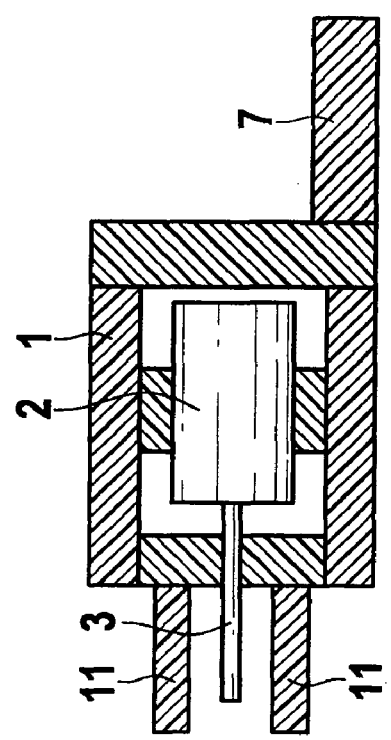
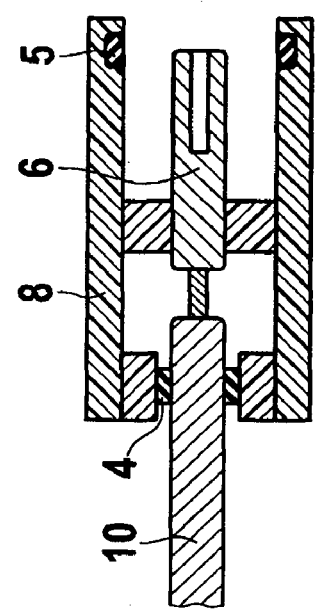

HOUSING HAVING AN ELECTRICAL COMPONENT AND AN ELECTRICAL FEED LINE

BACKGROUND INFORMATION

Electrical components or assemblies are often situated in a housing for protection from environmental influences. The housing is provided with an electrical feed line in many cases, using which information may be exchanged or a supply voltage may be supplied. The housing is often connected to the electrical feed line using an external plug connection for this purpose. In particular in safety-relevant components in motor vehicles, the external plug connection has additional locking means (plug retainer), which guarantee a proper plug connection, or also visual checking means (so-called red nails), which indicate whether the plug connection is securely plugged. The housing described often has fasteners for external fastening, such as a bushing or a pre-mounted screw. During the mounting, the housing is mounted in the motor vehicle and connected to the electrical feed line using the plug connection. For small electrical components, the external plug connection, as well as its locking means or checking means and the mounting means have a relatively large proportion of the housing volume and mass of the housing. The plugs and sockets typically used are frequently complexly constructed, require high dimensional precision, and often have multiple seal elements to ensure a secure contacting and sealing function. Under the conditions of restricted space, secure electrical connection, and the least possible susceptibility to mechanical strains on the housing, in particular due to vibrations, the most compact and simple housing shapes possible are desired.

SUMMARY OF THE INVENTION

The present invention relates to a housing having at least one electrical component and at least one electrical feed line. The housing has at least one through-opening, and the electrical feed line is guided through the through-opening from an external environment into the interior of the housing. There is an electrical connection between the electrical component and the electrical feed line. The housing according to the present invention having a feed line advantageously has no external plug or socket. Advantageously the constructive complexity of the housing may thus be decreased and therefore costs may be reduced. The housing according to the present invention is advantageously smaller than a typical housing according to the related art. In the housing according to the present invention, the electrical feed line may advantageously be inserted directly into the housing.

In an advantageous embodiment of the present invention, at least one first contact means is situated in the housing and at least one second contact means is situated on the electrical feed line, and the electrical component is electrically connected to the first contact means and the electrical feed line is electrically connected to the second contact means. The first contact means and the second contact means have an electrical contact connection to one another. The electrical feed line may advantageously thus be electrically connected to the component.

In an advantageous embodiment, the electrical contact connection is implemented as a disconnectable contact connection. The actual housing and the electrical feed line may thus advantageously be disconnected from one another for dismounting. It is also advantageous if the electrical contact connection is situated in the interior of the housing. The contact connection is thus advantageously protected from environmental influences.

In an advantageous embodiment of the present invention, the electrical feed line is permanently connected to the second contact means and the electrical feed line may be passed through the through-opening together with the second contact means. The component mounted in the finished, closed housing may thus be advantageously connected to the electrical feed line.

In an advantageous embodiment of the present invention, the housing is closed. Component and contact connection are advantageously protected particularly well against environmental influences in this way. It is also advantageous if the housing is implemented in one piece. This is possible due to the less complex construction of the housing according to the present invention compared with the related art and makes the housing simpler and less costly to manufacture.

In an advantageous embodiment of the present invention, a sealing means is situated in the through-opening between the housing and the electrical feed line. A closed housing may thus advantageously be provided. A strain relief for the electrical feed line may advantageously also be provided by the sealing means. The sealing means may advantageously comprise a plastic material, such as a resin or a putty, or an elastic material, such as an elastomer or a rubber. In another advantageous embodiment, the sealing means is an adhesive and produces a material bond to the electrical feed line.

In an advantageous embodiment of the present invention, guide means for positioning the electrical feed line or also the second contact means are situated in the housing interior to produce the electrical connection, in particular the disconnectable electrical contact connection. The production of the electrical connection between the feed line and the component is thus advantageously made easier or made possible at all under difficult constructive conditions, such as complicated configurations of the component, the through-opening, and also the first contact means with respect to one another.

It is also advantageous if the housing has one or more mounting means, which are capable of connecting the housing to a mount.

In a particularly advantageous embodiment of the present invention, the electrical component contains at least one micromechanical functional element, in particular a micromechanical sensor element.

For electrical components in motor vehicles, such as sensors, micromechanical functional elements, or particularly small components, an array of special advantages result for the housing according to the present invention having a component.

Precisely in peripheral acceleration sensors in typical housings, the plug connection (plug and socket on the housing) already forms a high proportion of the volume and mass of the housing. Depending on the configuration, vibration problems occur due to low-frequency resonance. In many cases, this requires the use of additional fasteners, e.g., additional bushings and screws. Due to the advantageous integration of the plug connection in the housing, mass and volume may be significantly reduced and the mechanical coupling of the housing to a fastening point or mount may be optimized, so that fewer mounting means or mounting means having smaller dimensions suffice.

The conventional used plugs and sockets frequently have complex constructions, require high dimensional precision, and often have multiple seal elements to ensure a secure contacting and sealing function. These requirements are dispensed with or at least simplified in the housing according to the present invention. This is also advantageous in particular if the present invention is used in motor vehicles, because components in this environment are particularly subjected to environmental influences such as dust, moisture, and large temperature variations.

Further advantages of the present invention are dispensing with the plug housing and the socket housing as well as a seal that may possibly be provided. Connected thereto, the additional locking means (plug retainer) or also the visual checking means (red nail) may advantageously also be dispensed with. Furthermore, a plug-in procedure may be dispensed with during mounting of the housing according to the present invention, because a plug connection has been dispensed with in the construction. Dispensing with the plug housing and the socket housing allows, in particular in small housings, a further extreme reduction in size of the housing and the overall space required for the mount of such a housing. Furthermore, increased reliability of the housing advantageously results due to dispensing with the plug and the plug seal.

BRIEF DESCRIPTION OF THE DRAWINGS

FIGS. 1a and 1b schematically show a housing having an electrical component and an electrical feed line according to the related art.

DETAILED DESCRIPTION

Figure 2:
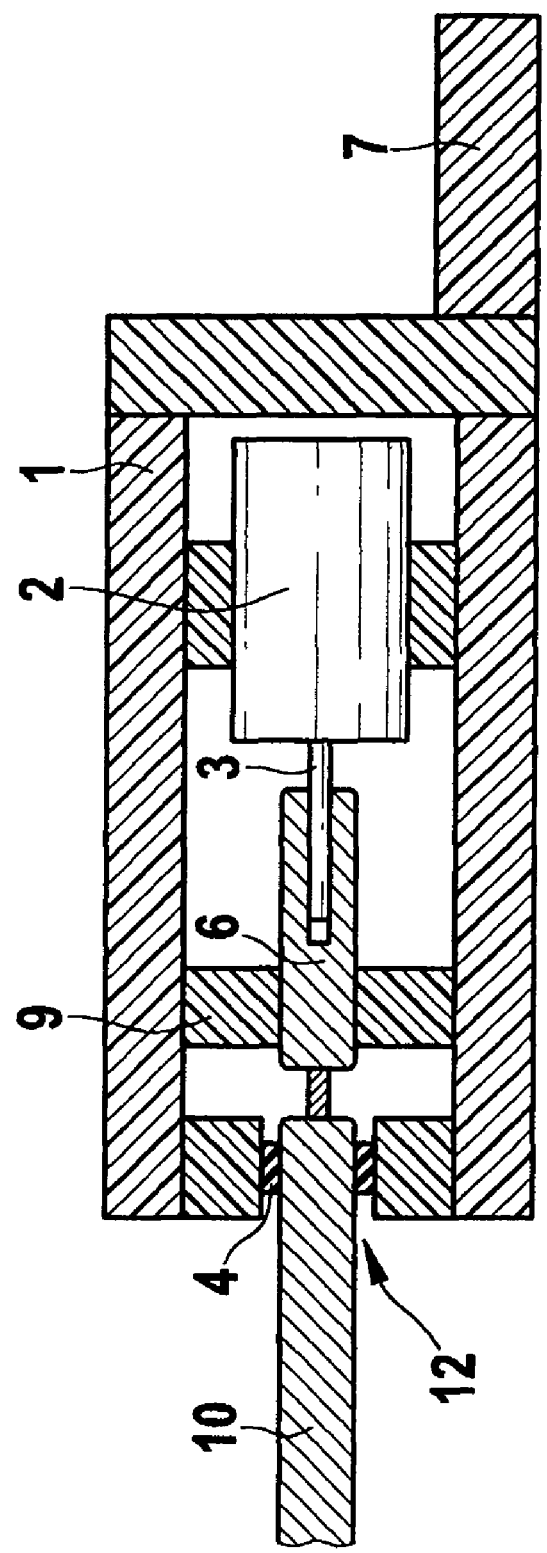
FIG. 2 schematically shows a housing according to the present invention having an electrical component and an electrical feed line.

FIGS. 1a and 1b schematically show a housing having an electrical component and an electrical feed line according to the related art.

FIG. 1b shows a closed housing 1 having an electrical component 2 situated therein. Mounting means 7 in the form of a tab for external fastening are provided on housing 1. A first contact means 3 in the form of contact pins, which are electrically connected to electrical component 2, is guided through a wall of housing 1. Housing 1 has a plug receptacle or a socket 11 in this area on its outside.

FIG. 1a shows an electrical feed line having a plug having a second contact means in the form of contact sockets. A line seal 4 is situated between a feed line 10 and a plug 8. A plug seal 5 is situated on plug 8 in the intended connection area of plug 8 to plug receptacle 11.

After plug 8 is plugged into plug receptacle 11, there is an electrical contact connection 3, 6, which is situated outside closed housing 1, between first and second contact means 3 and 6. Seals 4 and 5 are used for the purpose of providing a closed space around electrical contact connection 3, 6 and thus protect it from environmental influences. Plug 8 and plug receptacle 11 contribute significantly to the complexity, and, in particular in small housings, to the overall size of the object.

FIG. 2 schematically shows a housing according to the present invention having an electrical component and an electrical feed line. A closed housing 1 having an electrical component 2 situated therein is shown. Furthermore, a first contact means 3, which is electrically connected to electrical component 2, is situated in housing 1. Housing 1 has a through-opening 12 from the interior to the exterior, through which an electrical feed line 10 is guided. A sealing means 4 is situated in through-opening 12 between housing 1 and electrical feed line 10. A second contact means 6, which is electrically connected to feed line 10, is situated on electrical feed line 10. First contact means 3 and second contact means 6 have an electrical contact connection 3, 6 to one another, which is produced by mechanical connection of first and second contact means to one another. Electrical contact connection 3, 6 is preferably implemented as disconnectable. Electrical contact connection 3, 6 is situated inside housing 1. To close or open contact connection 3, 6, electrical feed line 10 having second contact means 6 located thereon may be inserted into the housing interior through through-opening 12 or removed therefrom.

In the exemplary embodiment described here, a guide means 9 for positioning electrical feed line 10 and/or second contact means 6 is also provided. Guide means 9 is situated in housing 1 in such a way that upon insertion of electrical feed line 10 and second contact means 6 through through-opening 12 into the housing interior, feed line 10 and second contact means 6 are brought into the correct position, so that contact connection 3, 6 may be closed.

Furthermore, housing 1 may have one or more mounting means 7, which are capable of connecting the housing to an external mount. Mounting means 7 may be a tab as illustrated here in FIG. 2.

In one embodiment of the present invention, electrical component 2 is a micromechanical component, in particular a micromechanical sensor such as an acceleration sensor. The sensor is situated in housing 1 and is connected to electrical feed line 10 in the form of a wire harness. The housing according to the present invention may be mounted complete with wire housing in a motor vehicle, for example.

In one exemplary embodiment of the housing according to the present invention, electrical feed line 10 having contact means 3 and optionally a seal 4 may be mounted directly in housing 1, corresponding to the current mounting process in the related art, in which electrical feed line 10 is mounted in plug 8. The terminal pins of the sensor electronics may also be contacted directly.

What is claimed is:

1. A housing comprising:
    at least one electrical component situated in the housing; and
    at least one electrical feed line guided through at least one through-opening of the housing from an external environment into an interior of the housing and axially connected to the at least one electrical component;
    a sealing element situated in the through-opening between the housing and the electrical feed line;
    a guide element, at least for positioning the electrical feed line and/or the second contact,
    wherein the sealing element is disposed closer to the external environment than the guide element,
    wherein the housing is one piece.

2. The housing according to claim 1, further comprising at least one first contact situated in the housing and at least one second contact situated on the electrical feed line, the electrical component being electrically connected to the first contact and the electrical feed line being electrically connected to the second contact, the first contact and the second contact forming an electrical contact connection to one another.

3. The housing according to claim 2, wherein the electrical contact connection is disconnectable.

4. The housing according to claim 2, wherein the electrical feed line is permanently connected to the second contact and the electrical feed line passes through the through-opening together with the second contact.

5. The housing according to claim 2, wherein the guide element is situated in the housing interior to produce the electrical connection, including the electrical contact connection.

6. The housing according to claim 2, wherein the electrical contact connection is situated in the interior of the housing.

7. The housing according to claim 1, wherein the housing is closed.

8. The housing according to claim 1, further comprising at least one mounting element for connecting the housing to a mount.

9. The housing according to claim 1, wherein the electrical component contains at least one micromechanical functional element, including a micromechanical sensor element.

10. The housing according to claim 1, wherein the electrical feed line is removable from the housing.

11. The housing according to claim 1, wherein the housing has no external plug or socket.

* * * * *